United States Patent [19]

Kimura

[11] Patent Number: 5,426,377
[45] Date of Patent: Jun. 20, 1995

[54] BIMIS CIRCUIT
[75] Inventor: Tohru Kimura, Tokyo, Japan
[73] Assignee: NEC Corporation, Japan
[21] Appl. No.: 208,827
[22] Filed: Mar. 11, 1994
[30] Foreign Application Priority Data Mar. 17, 1993 [JP] Japan ................... 5-056642
Apr. 6, 1993 [JP] Japan ................... 5-078398

[51] Int. Cl.[6] ........................... H03K 19/01
[52] U.S. Cl. ........................ 326/33; 326/34; 326/110
[58] Field of Search ............... 307/443, 446, 451, 475
[56]         References Cited
            U.S. PATENT DOCUMENTS

4,845,386  7/1989  Ueno ........................... 307/446
4,999,523  3/1991  Cham et al. ............... 307/443 X
5,313,116  5/1994  Murabayashi et al. ..... 307/443 X

*Primary Examiner*—David R. Hudspeth
*Attorney, Agent, or Firm*—Whitham, Curtis Whitham & McGinn

[57]             ABSTRACT

A BiMIS circuit includes a load pull-up bipolar transistor, a load pull-down bipolar transistor, a first MISFET and first and second MISFETs for driving the load pull-up bipolar transistor, and a third MISFET and a second MISFET for driving the load pull-down bipolar transistor. The second MISFET has a turn-on voltage lower than the turn-on voltage of the load pull-up bipolar transistor, and the second MISFET has a turn-on voltage lower than the turn-on voltage of the load pull-down bipolar transistor.

8 Claims, 9 Drawing Sheets

BIMIS CIRCUIT

BACKGROUND OF THE INVENTION

1. Field of the Invention

The present invention relates to a BiMIS circuit which may include a BiCMOS circuit.

2. Description of the Prior Art

LSI BiCMOS circuits (hereinafter referred to as "BiMIS circuits" in a broader sense) of silicon semiconductors which are most widely used at present are attracting much attention because they are characterized by both the high-speed operation of bipolar transistors (BJTs) and the high degree of integration and low power requirements of CMOS circuits (complementary MIS circuits) composed of MOSFETs (hereinafter referred to as "MISFETs").

Figure 1:
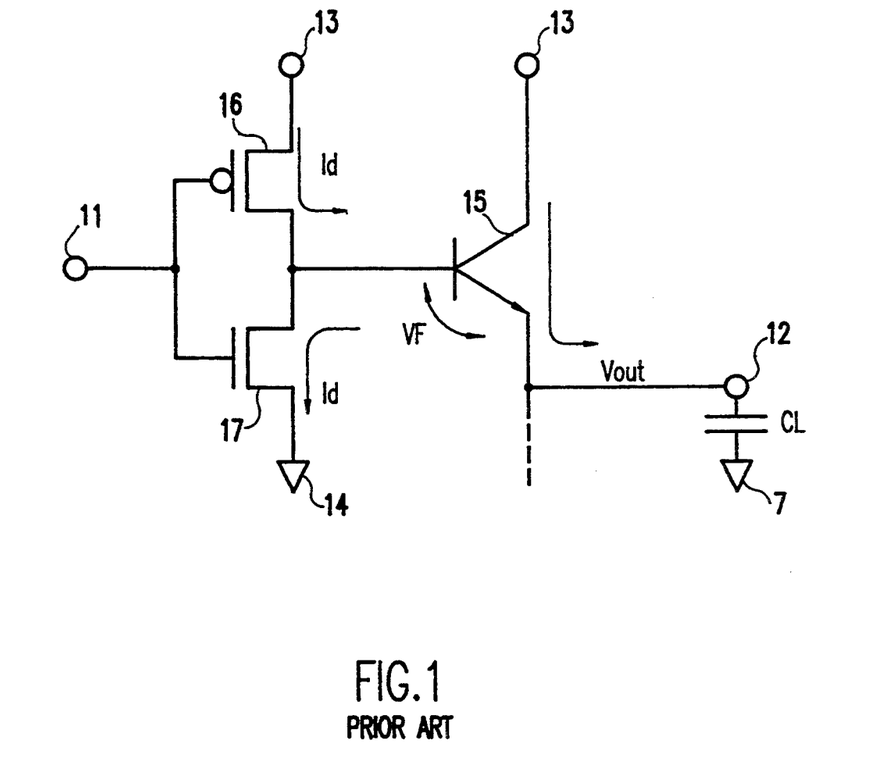
FIG. 1 is a circuit diagram of a basic arrangement of a conventional BiMIS circuit.
Figure 2:
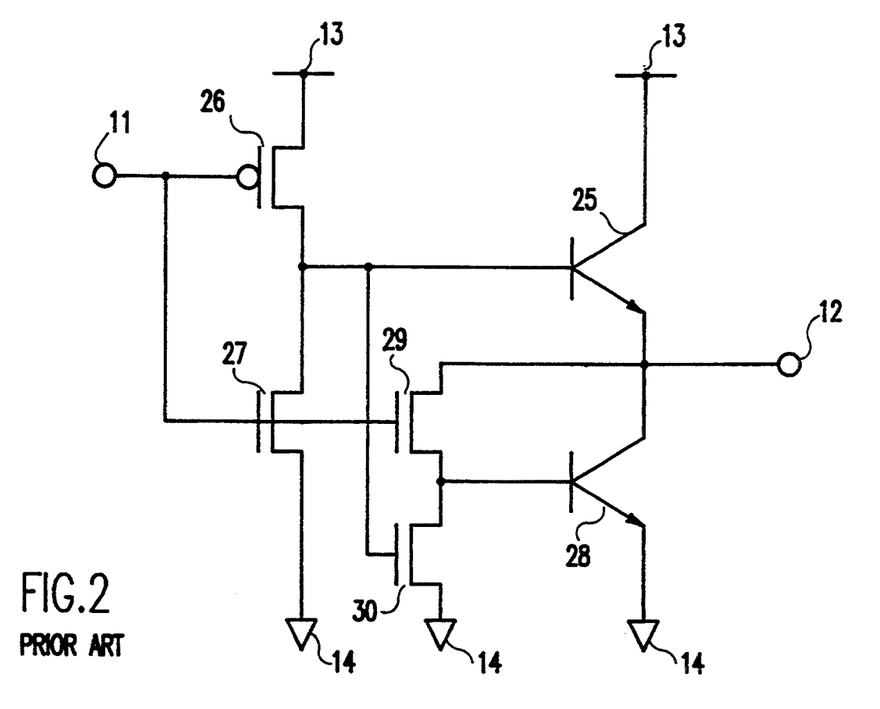
FIG. 2 is a circuit diagram of a conventional BiCMOS circuit.
Figure 3:
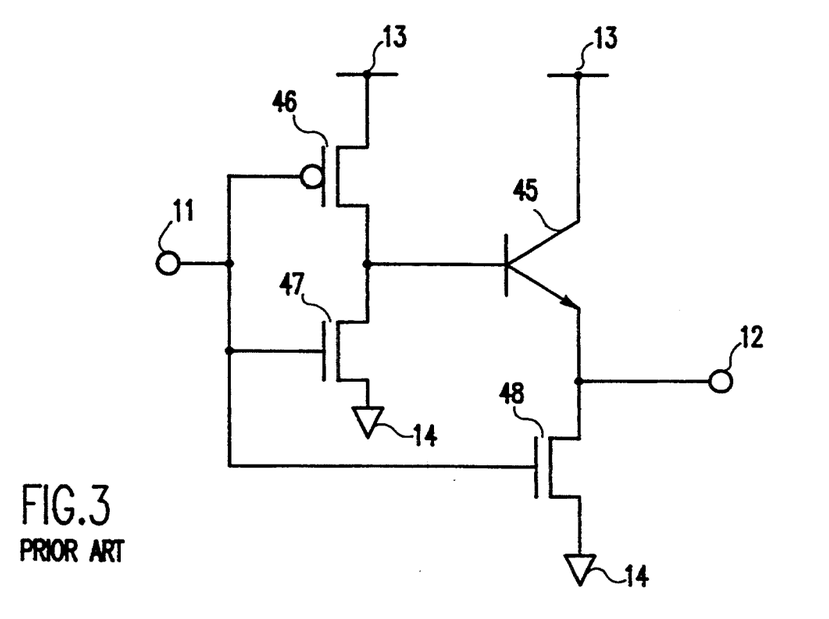
FIG. 3 is a circuit diagram of a conventional BiNMOS circuit.

FIG. 1 of the accompanying drawings shows a basic arrangement of a conventional BiMIS circuit. FIG. 2 of the accompanying drawings illustrates a conventional BiCMOS circuit. FIG. 3 of the accompanying drawings shows a conventional BiNMOS circuit. The BiCMOS circuit shown in FIG. 2 and the BiNMOS circuit shown in FIG. 3 are collectively called BiMIS circuits.

Basic operation of the BiMIS circuit shown in FIG. 1 will be described below.

In the BiMIS circuit, the base node of a BJT 15 is charged by a drain current Id of a PMOSFET 16 so that the potential at the base node becomes a turn-on voltage $V_F$ or higher, thus turning on (rendering conductive) the BJT 15, and the base node of the BJT 15 is discharged by a drain current Id of an NMOSFET 17 so that the potential at the base node becomes the turn-on voltage $V_F$ or lower, thus turning off (rendering nonconductive) the BJT 15. The BiMIS circuit quickly charges and discharges an external load capacitance CL based on the large load drive capability of the BJT 15.

A delay time $\tau pd$ of the BiMIS circuit at the time the external load capacitance CL is charged and discharged is given by:

$$\tau pd = (C_{EB} V_F)/Id + (\tfrac{1}{2})(CL\,VCC)/Ic \qquad (1)$$

where $C_{EB}$ is the emitter-to-base capacitance of the BJT 15, $V_F$ the turn-on voltage of the BJT 15, Id the drain current of the MOSFETs 16, 17, CL the external load capacitance, VCC a high-potential power supply voltage, and Ic the collector current of the BJT 15.

The first term of the equation (1) represents the self delay time of the BiMIS circuit in which the MOSFETs 16, 17 turn on and off the BJT 15. The second term of the equation (1) represents the time in which the BJT 15 charges and discharges the external load capacitance. Since the turn-on voltage $V_F$ of the BJT 15 is determined substantially by the band gap of a semiconductor which constitutes the base of the BJT 15, turn-on voltage $V_F$ of the BJT 15 is about 0.8 V if the BJT 15 comprises a bipolar transistor of silicon. The emitter-to-base capacitance $C_{EB}$ is determined by the area of the emitter of the BJT 15.

Logic levels and an output logic amplitude of the BiMIS circuit will be described below with reference to FIGS. 2 and 3 of the accompanying drawings.

When a signal of low level is applied to an input terminal 11 of the BiCMOS circuit shown in FIG. 2, a PMOSFET 26 is turned on, an NMOSFET 27 is turned off, an NMOSFET 29 is turned off, and an NMOSFET 30 is turned on. Therefore, a BJT 25 is turned on and a BJT 28 is turned off. Since the PMOSFET 26 is turned on, the potential at the base of the BJT 25, which serves as a load pull-up transistor, is held at a high potential VCC of a high-potential power supply terminal 13. The potential at the collector of the BJT 25 is also kept at the high potential VCC as the collector is connected to the high-potential power supply terminal 13. Therefore, the potential at the emitter of the BJT 25 which is connected to an output terminal 12 is equal to the difference between the potential at the base of the BJT 25 and a turn-off voltage $V_F$ of the BJT 25. The BiCMOS circuit shown in FIG. 2 thus outputs a high-level output voltage VOH (VCC$-V_F$) from the output terminal 12.

When a signal of high level is applied to the input terminal 11, the PMOSFET 26 is turned off, the NMOSFET 27 is turned on, the NMOSFET 29 is turned on, and the NMOSFET 30 is turned off. Therefore, the BJT 25 is turned off and the BJT 28 is turned on, applying a low-level signal to the output terminal 12. The potential at the emitter of the BJT 28, which serves as a load pull-down transistor, is held at a low potential GND of a low-potential power supply terminal 14. Since the NMOSFET 29 is turned on, the potential at the base of the BJT 28 rises higher than the potential (GND+$V_F$) which is a turn-on voltage of the BJT 28 higher than the emitter potential by $V_F$. The BiMIS circuit outputs the potential (GND+$V_F$) at the base of the BJT 28 as a low-level output voltage VOL from the output terminal 12. Consequently, the BiCMOS circuit shown in FIG. 2 has an output logic amplitude VL (VCC$-2V_F$).

When a signal of low level is applied to an input terminal 11 of the BiNMOS circuit shown in FIG. 3, a PMOSFET 46 is turned on, an NMOSFET 47 is turned off, and an NMOSFET 48 is turned off. Therefore, a high-level output voltage VOH of the BiNMIS circuit shown in FIG. 3 is of the same value (VCC$-V_F$) as the high-level output voltage of the BiCMOS circuit shown in FIG. 2.

When a signal of high level is applied to the input terminal 11, the PMOSFET 46 is turned off, the NMOSFET 47 is turned on, and the NMOSFET 48 is turned on. Therefore, the BJT 45 is turned off, applying a low-level output voltage to the output terminal 12. Since the NMOSFET 48 is turned on, the low-level output voltage is of a low potential GND. Therefore, the BiNMOS circuit shown in FIG. 3 has an output logic amplitude VL (VCC$-V_F$).

As disclosed in "BiCMOS Technology" (Kubo, et al., Electronic Information Communication Society, page 49) the conventional BiMIS circuit has a problem in that at low voltages of 3.3 V or less, it has an increased delay time and cannot maintain its speed advantage over the CMOS circuits. More specifically, as the power supply voltage of the conventional BiMIS circuit drops, the output logic amplitude of the conventional BiMIS circuit is lowered, thus causing the source-to-gate voltage VSG of a MOSFET in the input stage of the BiMIS circuit to drop, with a resulting reduction in the drain current Id of the MOSFET. Specifically, when the power supply voltage is reduced, the first term of the equation (1) abruptly increases, bringing about an increase in the delay time $\tau pd$ of the BiMIS circuit. The second term of the equation (2) is dependent on the characteristics of the BJT and the external load, and less dependent on the power supply voltage. As a consequence, when the power supply voltage is lowered, the delay time of the BiMIS circuit is increased.

If the high-potential power supply voltage is indicated by VCC and the low-potential voltage by GND, then the BJT 25 (see FIG. 2) has a base potential of up to VCC and a collector potential of VCC, with the result that the potential at its emitter as the output node does not exceed (VCC−$V_F$). Furthermore, since the BiCMOS circuit shown in FIG. 2 employs the BJTs 25, 28 which serve as load pull-up and pull-down transistors, respectively, for the output terminal 12 and which have a high load driving capability, the BiCMOS circuit can rapidly charge and discharge the load connected to the output terminal 12. However, inasmuch as the base and collector of the BJT 28 are short-circuited to discharge the load capacitance for reducing the load voltage, the load voltage cannot be made lower than the voltage $V_F$. The output logic amplitude of the BiCMOS circuit shown in FIG. 2 is thus equal to the power supply potential (VCC−2 $V_F$). If the BiCMOS circuit drives a MISFET in a next stage, then the source-to-gate voltage VSG of the MOSFET in the next stage drops, preventing it from operating at high speed.

The BiNMOS circuit shown in FIG. 3 has the NMOSFET 48 as a load pull-down transistor for lowering the voltage of the load to the GND level. The BiNMOS circuit has an output logic amplitude (VCC−$V_F$) which is higher than the logic amplitude of the BiCMOS circuit shown in FIG. 2 by the voltage VF. However, the MOSFET 48 does not have as large a driving capability as the BJT. If the MOSFET 48 is to be given as large a driving capability as the BJT, then the size and hence the input capacity of the MOSFET 48 will be increased, resulting in an increase in the time required to lower the output voltage.

SUMMARY OF THE INVENTION

It is an object of the present invention to provide a BiMIS circuit which is capable of operating at a higher speed than CMOS circuits even when the power supply voltage is of a low value of 3.3 V or less, is capable of lowering the output voltage to a low-potential power supply voltage level as with BiNMOS circuits, and is capable of lowering the output voltage at a higher speed than BiNMOS circuits by employing a BJT, which has a higher current driving capability than MOSFETs, as an output pull-down transistor.

Another object of the present invention is to provide a BiCMOS circuit which is capable of operating at a sufficiently high speed even when the power supply voltage is of a low value of 3.3 V or less.

According to an aspect of the present invention, there is provided a BiMIS circuit comprising an input terminal, an output terminal, a first npn-type bipolar transistor having a collector connected to a high-potential power supply terminal and an emitter connected to the output terminal, a first p-type field-effect transistor having a source connected to the high-potential power supply terminal, a gate connected to the input terminal, and a drain connected to the base of the first npn-type bipolar transistor, a first n-type field-effect transistor having a drain connected to the base of the first npn-type bipolar transistor and a gate connected to the input terminal, a second n-type field-effect transistor having a drain and a gate connected to the source of the first n-type field-effect transistor, and a source connected to a low-potential power supply terminal, a second npn-type bipolar transistor having a collector connected to the output terminal and an emitter connected to the low-potential power supply terminal, a third n-type field-effect transistor having a source connected to the base of the second npn-type bipolar transistor, a gate connected to the input terminal, and a drain connected to the drain and the gate of the second n-type field-effect transistor, and a second p-type field-effect transistor having a source connected to the base of the second npn-type bipolar transistor, a gate connected to the input terminal, and a drain connected to the low-potential power supply terminal, the arrangement being such that the second n-type field-effect transistor has a turn-on voltage lower than a turn-on voltage of the first npn-type bipolar transistor, and when the first npn-type bipolar transistor is nonconductive, the potential at the base of the first npn-type bipolar transistor is kept higher than the potential at the emitter of the first npn-type bipolar transistor by the turn-on voltage of the second n-type field-effect transistor, and that the second p-type field-effect transistor has a turn-on voltage lower than a turn-on voltage of the second npn-type bipolar transistor, and when the second npn-type bipolar transistor is nonconductive, the potential at the base of the second npn-type bipolar transistor is kept higher than the potential at the emitter of the second npn-type bipolar transistor by the turn-on voltage of the second p-type field-effect transistor.

According to another aspect of the present invention, there is provided a BiMIS circuit comprising an input terminal, an output terminal, a first pnp-type bipolar transistor having a collector connected to a low-potential power supply terminal and an emitter connected to the output terminal, a first n-type field-effect transistor having a source connected to the low-potential power supply terminal, a gate connected to the input terminal, and a drain connected to the base of the first pnp-type bipolar transistor, a first p-type field-effect transistor having a drain connected to the base of the first pnp-type bipolar transistor and a gate connected to the input terminal, a second p-type field-effect transistor having a drain and a gate connected to the source of the first p-type field-effect transistor and a source connected to a high-potential power supply terminal, a second pnp-type bipolar transistor having a collector connected to the output terminal and an emitter connected to the high-potential power supply terminal, a third p-type field-effect transistor having a source connected to the base of the second pnp-type bipolar transistor, a gate connected to the input terminal, and a drain connected to the drain and the gate of the second p-type field-effect transistor, and a second n-type field-effect transistor having a source connected to the base of the second pnp-type bipolar transistor, a gate connected to the input terminal, and a drain connected to the high-potential power supply terminal, the arrangement being such that the second p-type field-effect transistor has a turn-on voltage lower than a turn-on voltage of the first pnp-type bipolar transistor, and when the first pnp-type bipolar transistor is nonconductive, the potential at the base of the first pnp-type bipolar transistor is kept lower than the potential at the emitter of the first pnp-type bipolar transistor by the turn-on voltage of the second p-type field-effect transistor, and that the second n-type field-effect transistor has a turn-on voltage lower than a turn-on voltage of the second pnp-type bipolar transistor, and when the second pnp-type bipolar transistor is nonconductive, the potential at the base of the second pnp-type bipolar transistor is kept lower than the potential at the emitter of the second pnp-type bipolar transistor by the turn-on voltage of the second n-type field-effect transistor.

According to still another aspect of the present invention, there is provided a BiCMOS circuit comprising an input terminal, an output terminal, a bipolar transistor having a base connected to the input terminal, an emitter connected to a first power supply terminal, and a collector connected to the output terminal and through a load to a second power supply terminal, and a field-effect transistor having a source and a gate connected to the input terminal and a drain connected to the first power supply terminal so that the field-effect transistor is rendered conductive when the bipolar transistor is nonconductive, the arrangement being such that the field-effect transistor has a turn-on voltage lower than a turn-on voltage of the bipolar transistor, and when the bipolar transistor is nonconductive, the potential at the base of the bipolar transistor is kept at a level which is different from the potential at the emitter of the bipolar transistor by the turn-on voltage of the field-effect transistor. The bipolar transistor may comprise an npn-type bipolar transistor, the field-effect transistor may comprise a p-type field-effect transistor, the first power supply terminal may comprise a low-potential power supply terminal, and the second power supply terminal may comprise a high-potential power supply terminal. Alternatively, the bipolar transistor may comprise a pnp-type bipolar transistor, the field-effect transistor may comprise an n-type field-effect transistor, the first power supply terminal may comprise a high-potential power supply terminal, and the second power supply terminal may comprise a low-potential power supply terminal.

According to yet still another aspect of the present invention, there is provided a BiCMOS circuit comprising an input terminal, an output terminal, a first npn-type bipolar transistor having a collector connected to a high-potential power supply terminal and an emitter connected to the output terminal, a first p-type field-effect transistor having a source connected to the high-potential power supply terminal, a gate connected to the input terminal, and a drain connected to the base of the first npn-type bipolar transistor, a second p-type field-effect transistor having a drain connected to the base of the first npn-type bipolar transistor, a gate connected to the output terminal, and a drain connected to a low-potential power supply terminal, a second npn-type bipolar transistor having a collector connected to the output terminal and an emitter connected to the low-potential power supply terminal, a first n-type field-effect transistor having a source connected to the base of the second npn-type bipolar transistor, a gate connected to the input terminal, and a drain connected to the output terminal, and a third p-type field-effect transistor having a source connected to the base of the second npn-type bipolar transistor, a gate connected to the input terminal, and a drain connected to the low-potential power supply terminal, the arrangement being such that the second p-type field-effect transistor has a turn-on voltage lower than a turn-on voltage of the first npn-type bipolar transistor, and when the first npn-type bipolar transistor is nonconductive, the potential at the base of the first npn-type bipolar transistor is kept higher than the potential at the emitter of the first npn-type bipolar transistor by the turn-on voltage of the second p-type field-effect transistor, and that the third p-type field-effect transistor has a turn-on voltage lower than a turn-on voltage of the second npn-type bipolar transistor, and when the second npn-type bipolar transistor is nonconductive, the potential at the base of the second npn-type bipolar transistor is kept higher than the potential at the emitter of the second npn-type bipolar transistor by the turn-on voltage of the third p-type field-effect transistor.

According to a further aspect of the present invention, there is provided a BiCMOS circuit comprising an input terminal, an output terminal, a first npn-type bipolar transistor having a collector connected to a high-potential power supply terminal and an emitter connected to the output terminal, a first p-type field-effect transistor having a source connected to the high-potential power supply terminal, a gate connected to the input terminal, and a drain connected to the base of the first npn-type bipolar transistor, a first n-type field-effect transistor having a drain connected to the base of the first npn-type bipolar transistor and a gate connected to the input terminal, a second n-type field-effect transistor having a drain and a gate connected to the source of the first n-type field-effect transistor and a source connected to a low-potential power supply terminal, a second npn-type bipolar transistor having a collector connected to the output terminal and an emitter connected to the low-potential power supply terminal, a third n-type field-effect transistor having a source connected to the base of the second npn-type bipolar transistor, a gate connected to the input terminal, and a drain connected to the output terminal, and a second p-type field-effect transistor having a source connected to the base of the second npn-type bipolar transistor, a gate connected to the input terminal, and a drain connected to the low-potential power supply terminal, the arrangement being such that the second n-type field-effect transistor has a turn-on voltage lower than a turn-on voltage of the first npn-type bipolar transistor, and when the first npn-type bipolar transistor is nonconductive, the potential at the base of the first npn-type bipolar transistor is kept higher than the potential at the emitter of the first npn-type bipolar transistor by the turn-on voltage of the second n-type field-effect transistor, and that the second p-type field-effect transistor has a turn-on voltage lower than a turn-on voltage of the second npn-type bipolar transistor, and when the second npn-type bipolar transistor is nonconductive, the potential at the base of the second npn-type bipolar transistor is kept higher than the potential at the emitter of the second npn-type bipolar transistor by the turn-on voltage of the second p-type field-effect transistor.

According to a still further aspect of the present invention, there is provided a BiCMOS circuit comprising an input terminal, an output terminal, a first npn-type bipolar transistor having a collector connected to a high-potential power supply terminal and an emitter connected to the output terminal, a first p-type field-effect transistor having a source connected to the high-potential power supply terminal, a gate connected to the input terminal, and a drain connected to the base of the first npn-type bipolar transistor, a first n-type field-effect transistor having a drain and a gate connected to the drain of the first p-type field-effect transistor, a second n-type field-effect transistor having a drain connected to the source of the first p-type field-effect transistor, a gate connected to the input terminal, and a source connected to a low-potential power supply terminal, a second npn-type bipolar transistor having a collector connected to the output terminal and an emitter connected to the low-potential power supply terminal, a third n-type field-effect transistor having a source connected to the base of the second npn-type bipolar transistor, a gate connected to the input terminal, and a drain connected to the output terminal, and a second p-type field-effect transistor having a source connected to the base of the second npn-type bipolar transistor, a gate connected to the input terminal, and a drain connected to the low-potential power supply terminal, the arrangement being such that the first n-type field-effect transistor has a turn-on voltage lower than a turn-on voltage of the first npn-type bipolar transistor, and when the first npn-type bipolar transistor is nonconductive, the potential at the base of the first npn-type bipolar transistor is kept higher than the potential at the emitter of the first npn-type bipolar transistor by the turn-on voltage of the first n-type field-effect transistor, and that the second p-type field-effect transistor has a turn-on voltage lower than a turn-on voltage of the second npn-type bipolar transistor, and when the second npn-type bipolar transistor is nonconductive, the potential at the base of the second npn-type bipolar transistor is kept higher than the potential at the emitter of the second npn-type bipolar transistor by the turn-on voltage of the second p-type field-effect transistor.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 4:
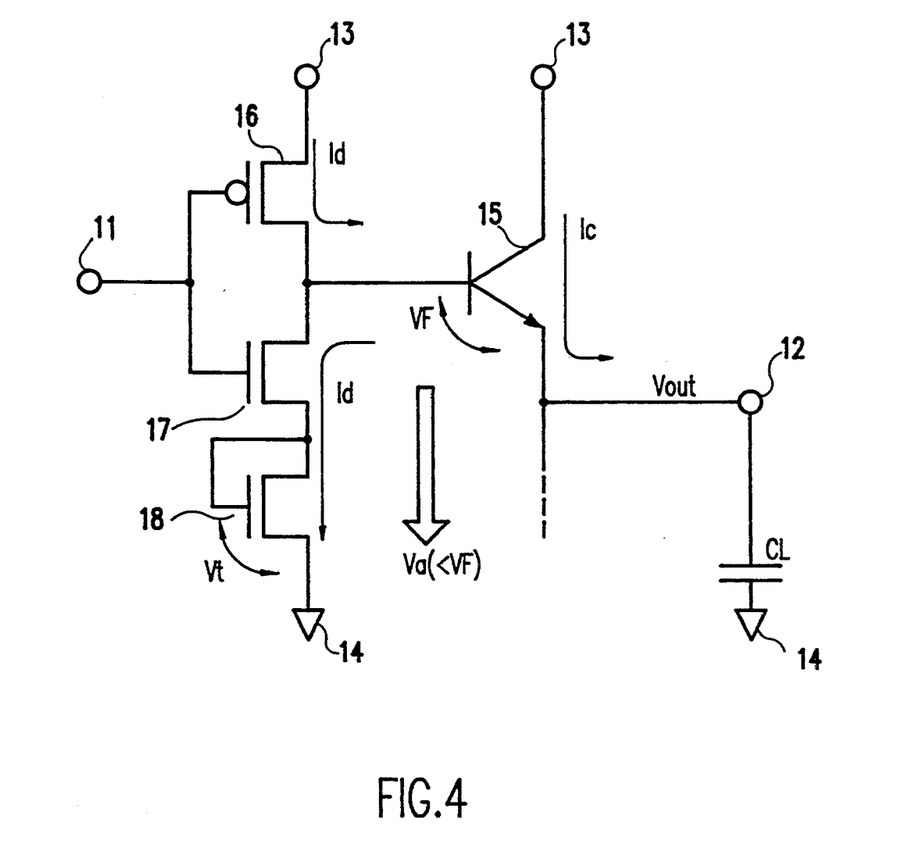
FIG. 4 is a circuit diagram of a basic arrangement of a BiMIS circuit according to the present invention.

A basic arrangement of a BiMIS circuit according to the present invention is illustrated in FIG. 4. The BiMIS circuit shown in FIG. 4 operates as follows: The base of a BJT 15 is charged and discharged by drain currents Id of MOSFETs 16, 17 for thereby turning on and off the BJT 15. Since the BJT 15 has a large load driving capability, the BiMIS circuit can quickly charge and discharge a load capacitance connected to an output terminal 12.

In order to allow the BiMIS circuit to operate at high speed at a low power supply potential, it is necessary to reduce the first term of the equation (1). To this end, it is necessary to increase the drain currents Id of the MOSFETs 16, 17. According to a general circuit design practice, the gate width Wg of the MOSFETs may be increased. However, such a solution would not be preferable because an increased gate width would increase the input capacitance of the BiMIS circuit.

With the conventional circuit arrangement shown in FIG. 1, when the BJT 15 is to be turned on, it is necessary to vary the low potential at the base of the BJT 15 from its emitter potential, i.e., the low-potential level (GND level) of an ordinary BiMIS circuit, to a potential that is higher than the base potential by the voltage $V_F$. Therefore, the voltage $V_F$ is included in the first term of the equation (1). The BJT 15 is turned on when the turn-on voltage $V_F$ is applied as the emitter-to-base voltage VEB.

In FIG. 4, with the potential at the base of the BJT 15 being kept at a potential that is higher than the emitter potential thereof by a turn-on voltage $V_T$ of a MOSFET 18, even when the turn-on voltage $V_F$ is applied as the emitter-to-base voltage VEB of the BJT 15, any change Va in the base potential of the BJT 15 can be reduced to (Va=$V_F$−$V_T$). Thus, the voltage $V_F$ in the first term of the equation (1) becomes Va=$V_F$−$V_T$, with the result that the first term of the equation (1) is reduced.

Figure 5:
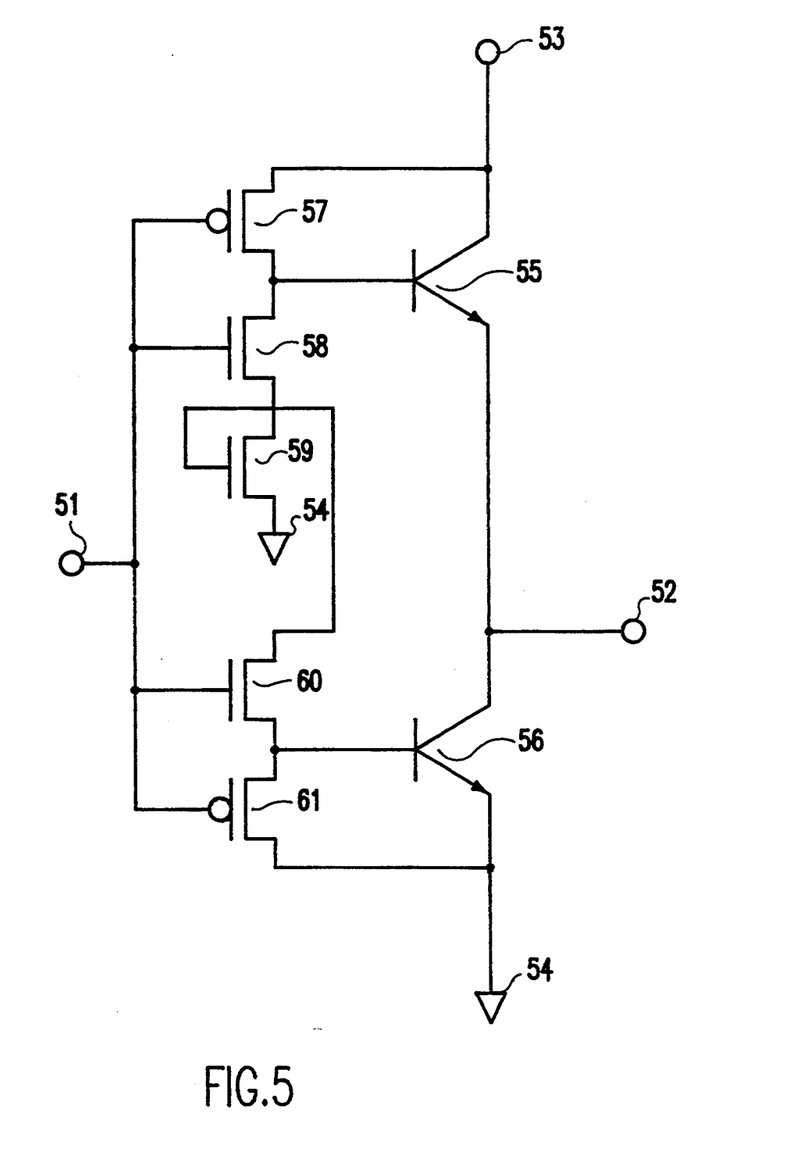
FIG. 5 is a circuit diagram of a first embodiment of a BiMIS circuit according to the present invention.

FIG. 5 shows a first embodiment of a BiMIS circuit according to the present invention.

As shown in FIG. 5, the BiMIS circuit comprises an input terminal 51, an output terminal 52, a high-potential power supply terminal 53, a low-potential power supply terminal 54, an npn-type bipolar transistor (BJT) 55 having a collector connected to the high-potential power supply terminal 53 and an emitter connected to the output terminal 52, an npn-type bipolar transistor (BJT) 56 having a collector connected to the output terminal 52 and an emitter connected to the low-potential power supply terminal 54, a p-type field-effect transistor (PMOSFET) 57 having a source connected to the high-potential power supply terminal 53, a gate connected to the input terminal 51, and a drain connected to the base of the npn-type bipolar transistor 55, an n-type field-effect transistor (NMOSFET) 58 having a drain connected to the base of the npn-type bipolar transistor 55 and a gate connected to the input terminal 51, an n-type field-effect transistor (NMOSFET) 59 having a drain and a gate connected to the source of the n-type field-effect transistor 58 and a source connected to the low-potential power supply terminal 54, an n-type field-effect transistor (NMOSFET) 60 having a source connected to the base of the npn-type bipolar transistor 56, a gate connected to the input terminal 51, and a drain connected to the drain and gate of the n-type field-effect transistor 59, and a p-type field-effect transistor (PMOSFET) 61 having a source connected to the base of the npn-type bipolar transistor 56, a gate connected to the input terminal 51, and a drain connected to the low-potential power supply terminal 54.

The BJTs 55, 56 of the BiMIS circuit shown in FIG. 5 have a turn-on voltage $V_F$ that is determined by the semiconductor material of these BJTs. If the BJTs 55, 56 are made of a silicon semiconductor, then their turn-on voltage $V_F$ is about 0.8 V. The PMOSFET 61 has a turn-on voltage Vtp and the NMOSFET 59 has a turn-on voltage Vtn, the turn-on voltages Vtp, Vtn being selected in the ranges: $|Vtp| < |V_F|$, $|Vtn| < |V_F|$.

With such turn-on voltage settings, a low potential at the base node of the BJT 55 does not drop below the turn-on voltage Vtn of the NMOSFET 59, and a low potential at the base node of the BJT 56 does not drop below the turn-on voltage Vtp of the PMOSFET 61. Therefore, in order to turn on the BJT 55, an electric charge Q55 expressed by the equation (2), given below, may be injected into the base node of BJT 55 through the MISFET 57:

$$Q55 = CEB55 \times (V_F - Vtn) \qquad (2)$$

where CEB55 is the base capacitance of the BJT 55.

In order to turn on the BJT 56, an electric charge Q56 expressed by the equation (3), given below, may be injected into the base node of BJT 56 through the MISFET 60:

$$Q56 = CEB56 \times (V_F - Vtp) \qquad (3)$$

where CEB56 is the base capacitance of the BJT 56.

If it is assumed that a drive current for the MISFETs 57, 60 is represented by $I_{57}$, $I_{60}$, then respective turn-on times $\tau 55$, $\tau 56$ of the BJTs 55, 56 are expressed as follows:

$$\tau 55 = Q55/I_{57} = CEB55 \times (V_F - Vtn)/I_{57},$$

$$\tau 56 = Q56/I_{60} = CEB56 \times (V_F - Vtp)/I_{60}.$$

Therefore, the BJT 55, which serves as a load pull-up transistor, can be turned on more quickly by $CEB55 \times (Vtn/I_{57})$ than an ordinary BiMIS circuit in which the low potential at the base node is lowered to the same potential as the emitter potential, and the BJT 56, which serves as a load pull-down transistor, can be turned on more quickly by $CEB56 \times (Vtp/I_{60})$ than an ordinary BiMIS circuit.

Unlike the conventional BiMIS circuit, the base and collector of the BJT 56 are not short-circuited when the voltage applied to the load connected to the output terminal 52 is lowered. Therefore, the BiMIS circuit according to the first embodiment shown in FIG. 5 can lower the voltage applied to the load to the GND level, and hence, the BiMIS circuit has a large logic amplitude (VCC−$V_F$) based on the high-speed load charging and discharging capability of the BJT 56. When a circuit composed of a MISFET is connected in a next stage, the source-to-gate voltage VSG of the MOSFET can be greater than the conventional BiMIS circuit by the BJT turn-on voltage $V_F$(~0.8 V), allowing the gate of the MOSFET in the next stage to operate at high speed. The BiMIS circuit shown in FIG. 5 can be turned on and off more quickly than the conventional BiMIS circuit by respective times commensurate with the turn-on voltage $V_F$ of the BJTs 55, 56, and has a load pull-up time $\tau \tau$ which is almost the same as the conventional BiMIS circuit. Therefore, the BiMIS circuit shown in FIG. 5 is free of design drawbacks which would otherwise be caused by largely different load pull-up and pull-down times $\tau r$, $\tau f$ as is the case with a BiNMOS circuit.

The BiMIS circuit according to the first embodiment has a high-level output voltage VOH (=VCC−$V_F$) and a low-level output voltage VOL (=GND). Accordingly, if it is assumed that a change Va in the potential at the bases of the BJTs 55, 56 is 0.2 V, then the BiMIS circuit can be designed such that the PMOSFET 61 has a turn-on voltage Vtp61:

$$Vtp61 = 0.2 - 0.8 = -0.6 \ V,$$

and the NMOSFET 59 has a turn-on voltage Vtn59:

$$Vtn59 = 0.8 - 0.2 = 0.6 \ V.$$

Figure 6:
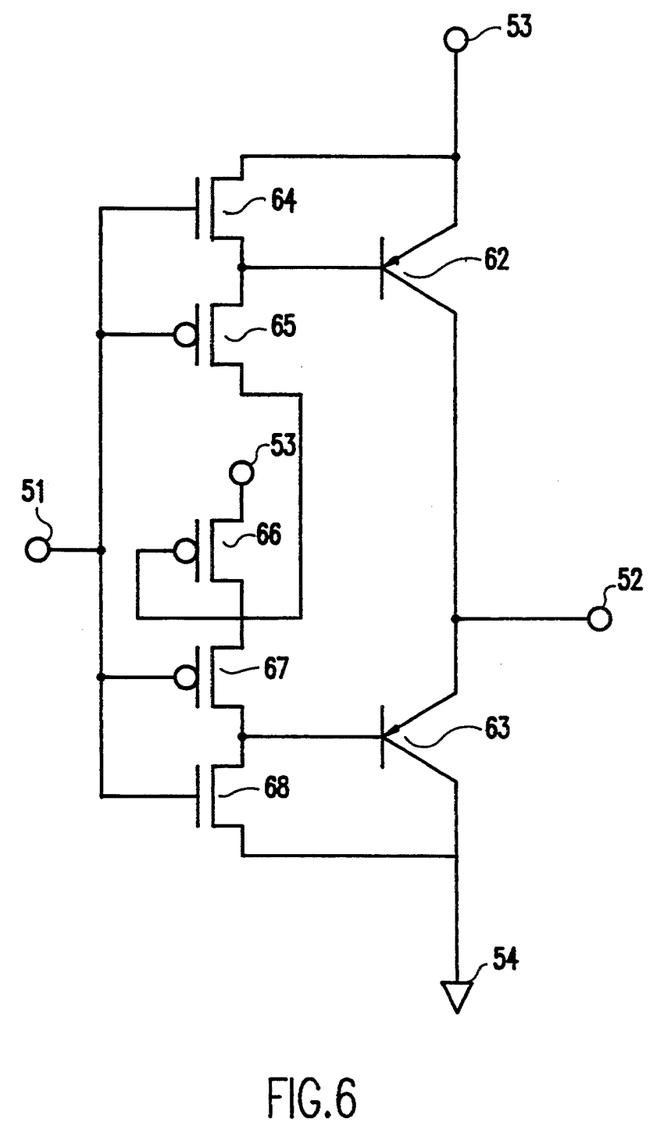
FIG. 6 is a circuit diagram of a second embodiment of a BiMIS circuit according to the present invention.

FIG. 6 shows a second embodiment of a BiMIS circuit according to the present invention. The BiMIS circuit shown in FIG. 6 differs from the BiMIS circuit shown in FIG. 5 in that pnp-type BJTs 62, 63 are employed in place of the npn-type BJTs 55, 56, NMOSFETs 64, 68 are employed in place of the PMOSFETs 57, 61, and PMOSFETs 65, 66, 67 are employed in place of the NMOSFETs 58, 59, 60. Therefore, the BiMIS circuit shown in FIG. 6 is complementary to the BiMIS circuit shown in FIG. 5. The principles of operation and design considerations of the BiMIS circuit shown in FIG. 6 are the same as those of the BiMIS circuit shown in FIG. 5 and will not be described in detail below.

Assuming a BiCMOS process with 0.55 μm, a CMOS inverter circuit and an inverter circuit composed of the BiMIS circuit according to the present invention are compared with each other under the conditions of an input capacitance of 0.1 pF, fan-out 4, and VCC=2 V. As a result, the BiMIS circuit according to the present invention operates 1.4 times faster and has a power requirement 40% less than the CMOS inverter circuit.

In the BiMIS circuit according to the present invention, the current flowing at the time the BJTs are turned off is increased. However, the current increase is 1/2200 of the current that flows at the time the BJTs are turned on, and hence is negligible.

As described above, in the BiMIS circuit according to the present invention, when the BJTs are nonconductive, the base potential thereof is kept higher than the emitter potential thereof by the turn-on voltage of the FETs. Therefore, the time required to turn on the BJTs is greatly reduced, with the result that the BJTs can operate more quickly at a voltage of 3.3 V or lower than a CMOS circuit having the same process, input capacitance, and power supply voltage. Under the same power supply voltage, the BiMIS circuit according to the present invention has a logic amplitude that is $V_F$ (~0.8 V) higher than the conventional BiCMOS circuit. The BiMIS circuit according to the present invention can therefore be a very useful basic gate circuit for use in an LSI circuit that is required to operate at high speed with low voltage requirements.

Figure 7:
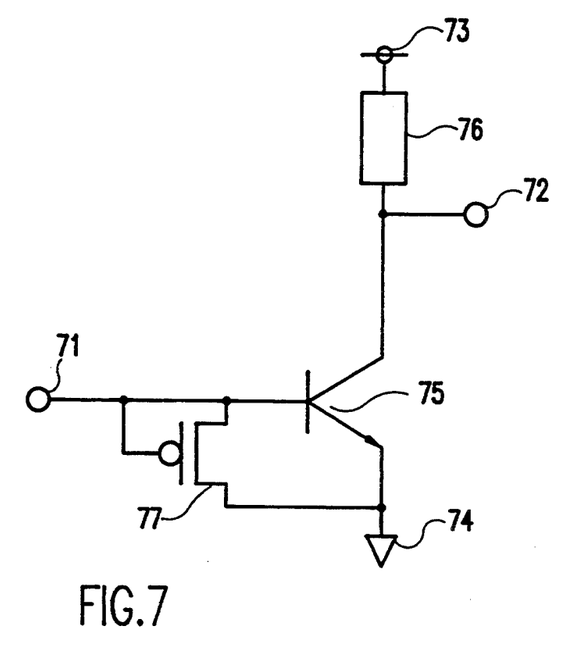
FIG. 7 is a circuit diagram of a third embodiment of a BiMIS circuit according to the present invention.

FIG. 7 shows a third embodiment of a BiMIS circuit according to the present invention. The BiCMOS circuit shown in FIG. 7 comprises an input terminal 71, an output terminal 72, a high-potential power supply terminal 73, a low-potential power supply terminal 74, an npn-type bipolar transistor (BJT) 75, and a p-type field-effect transistor (PMOSFET) 77. The npn-type bipolar transistor 75 has a collector connected through a load 76 to the high-potential power supply terminal 73, a base connected to the input terminal 71, and an emitter connected to the low-potential power supply terminal 74. The p-type field-effect transistor 77 has a source and a gate connected to the input terminal 71 and a drain connected to the low-potential power supply terminal 74.

The BJT 75 has a turn-on voltage $V_F$ and the PMOSFET 77 has a turn-on voltage Vtp, the turn-on voltages $V_F$, Vtp being selected in the range: $|Vtp| < |V_F|$. This is because the turn-on voltage Vtp can only be adjusted or varied basically by varying the semiconductor material of the BJT 75. Since a low potential at the base node of the BJT 75 does not drop below the turn-on voltage Vtp of the PMOSFET 77, an electric charge Qnpn expressed by the equation (4), given below, may be injected into the base node of BJT 75 in order to turn on the BJT 75:

$$Qnpn = CEB \times (V_F - Vtp) \qquad (4)$$

where CEB is the base capacitance of the BJT 75.

Using a current I for driving the BJT 75, a turn-on time τnpn(on) of the BJT 75 is expressed as follows:

$$\begin{aligned} \tau npn(on) &= Qnpn/I \\ &= CEB \times (V_F/I - Vtp/I). \end{aligned} \qquad (5)$$

The BJT 75 can thus be turned on more quickly by CEB×(Vtp/I) than an ordinary BiCMOS circuit in which the low potential at the base node is lowered to the same potential as the emitter potential.

Figure 8:
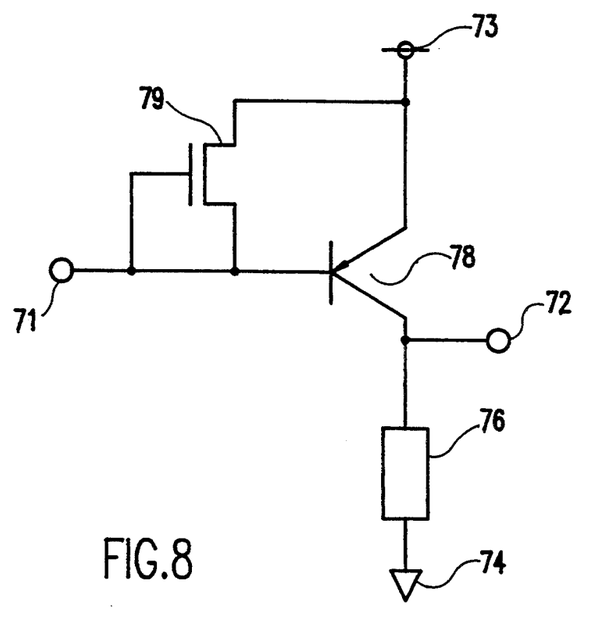
FIG. 8 is a circuit diagram of a fourth embodiment of a BiMIS circuit according to the present invention.

FIG. 8 shows a fourth embodiment of a BiMIS circuit according to the present invention. The BiCMOS circuit shown in FIG. 8 includes a pnp-type bipolar transistor 78 and an n-type field-effect transistor 79. The pnp-type bipolar transistor 78 has an emitter connected to a high-potential power supply terminal 73, a base connected to an input terminal 71, and a collector connected through a load 76 to a low-potential power supply terminal 74. The n-type field-effect transistor 79 has a source and a gate connected to the input terminal 71 and a drain connected to the high-potential power supply terminal 73.

The BiCMOS circuit shown in FIG. 8 differs from the BiCMOS circuit shown in FIG. 7 only in that the bipolar transistor 78 and the field-effect transistor 79 have opposite conductivity types to those of the bipolar transistor 75 and the field-effect transistor 77 shown in FIG. 7. The BiCMOS circuit shown in FIG. 8 operates in the same manner as the BiCMOS circuit shown in FIG. 7.

Figure 9:
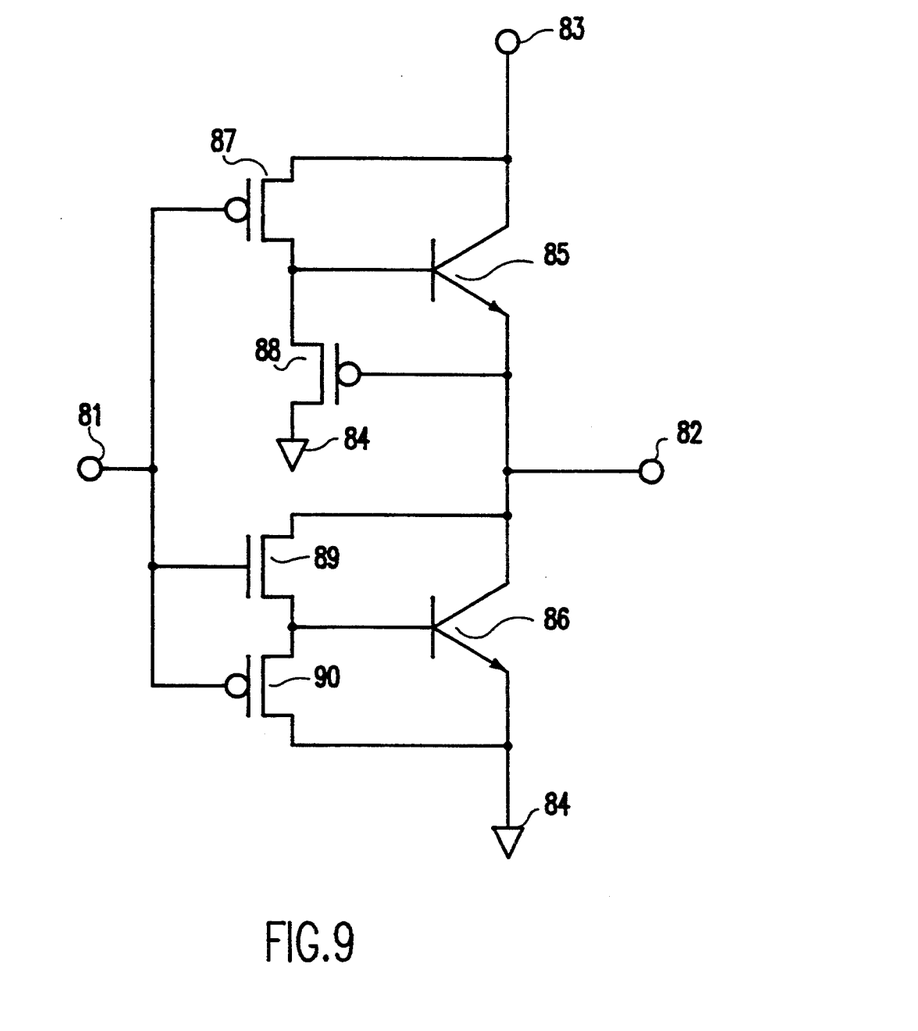
FIG. 9 is a circuit diagram of a fifth embodiment of a BiMIS circuit according to the present invention.

FIG. 9 shows a fifth embodiment of a BiMIS circuit according to the present invention. The BiCMOS circuit shown in FIG. 9 comprises an input terminal 81, an output terminal 82, a high-potential power supply terminal 83, a low-potential power supply terminal 84, an npn-type bipolar transistor (BJT) 85 having a collector connected to the high-potential power supply terminal 83 and an emitter connected to the output terminal 82, an npn-type bipolar transistor (BJT) 86 having a collector connected to the output terminal 82 and an emitter connected to the low-potential power supply terminal 84, a p-type field-effect transistor (PMOSFET) 87 having a gate connected to the input terminal 81 and a drain connected to the base of the npn-type bipolar transistor 85, a p-type field-effect transistor (PMOSFET) 88 having a source connected to the base of the npn-type bipolar transistor 85, a gate connected to the output terminal 82, and a drain connected to the low-potential power supply terminal 84, an n-type field-effect transistor (NMOSFET) 89 having a source Connected to the base of the npn-type bipolar transistor 86, a gate connected to the input terminal 81, and a drain connected to the output terminal 82, and a p-type field-effect transistor (PMOSFET) 90 having a source connected to the base of the npn-type bipolar transistor 86, a gate connected to the input terminal 81, and a drain connected to the low-potential power supply terminal 84.

The BJTs 85, 86 of the BiMIS circuit according to the fifth embodiment have a turn-on voltage $V_F$ of 0.8 V. The BiCMOS circuit has a high-level potential VOH (VCC−$V_F$), and a low-level potential VOL (GND+$V_F$). Therefore, a low-level potential at the emitter of the BJT 85, which serves as a load pull-up transistor, is (GND+$V_F$), and a low-level potential at the emitter of the BJT 86, which serves as a load pull-down transistor, is GND. A low-level potential at the base of the BJT 85 is determined by a turn-on voltage Vtp88 of the PMOSFET 88, and a low-level potential at the base of the BJT 86 is determined by a turn-on voltage Vtp90 of the PMOSFET 90.

Accordingly, if it is assumed that a change Va in the potential at the bases of the BJTs 85, 86 is 0.2 V, then the BiCMOS circuit can be designed such that the turn-on voltage Vtp88 of the PMOSFET 88 is:

$$\begin{aligned} Vtp88 &= V_F + (V_F - Va) \\ &= 0.8 + (0.8 - 0.2) \\ &= 1.4 \ V. \end{aligned}$$

And the turn-on voltage Vtp90 of the PMOSFET 90 is:

$$\begin{aligned} |Vtp90| &= |V_F - Va| \\ &= |0.8 - 0.2| = 0.6 \ V. \end{aligned}$$

Figure 10:
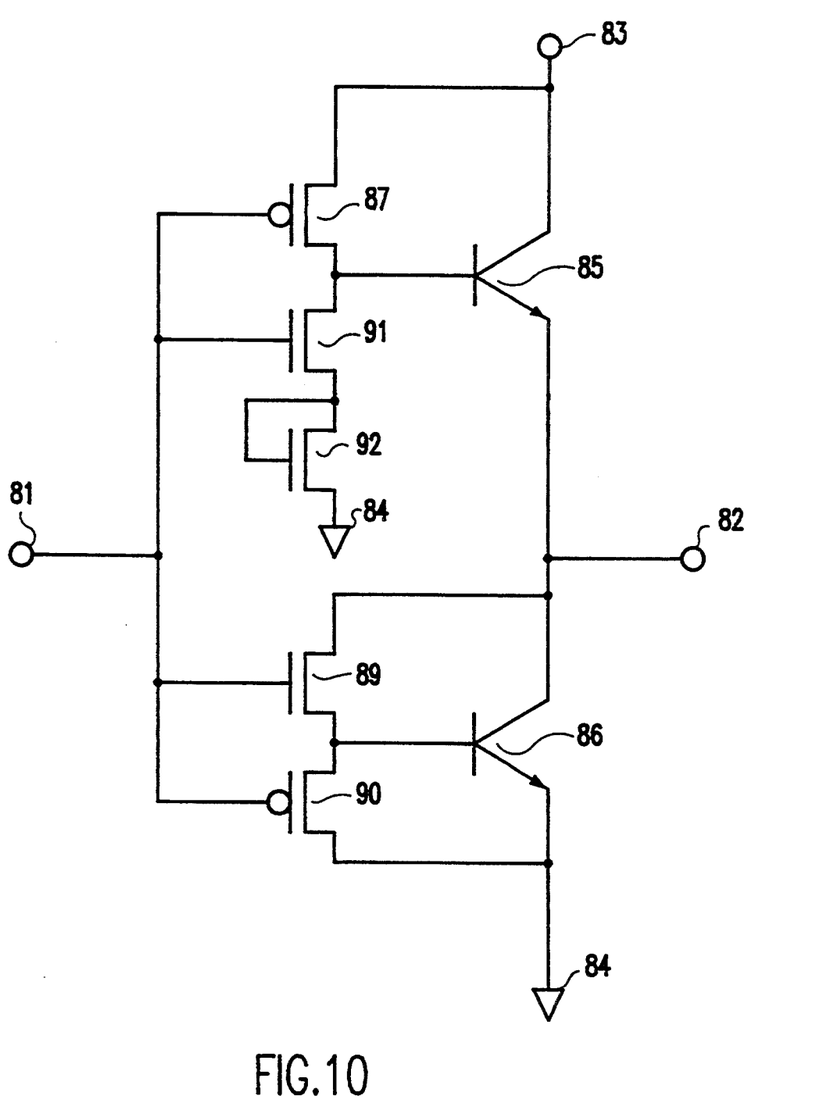
FIG. 10 is a circuit diagram of a sixth embodiment of a BiMIS circuit according to the present invention.

FIG. 10 shows a sixth embodiment of a BiMIS circuit according to the present invention. In the third embodiment shown in FIG. 9, since the gate of the PMOSFET 88 is connected to the output terminal 82, a delay occurs when the potential at the base of the BJT 85 drops, thus delaying the lowering of the output voltage. The BiCMOS circuit shown in FIG. 10 is arranged to improve the delay in the reduction of the output voltage.

As shown in FIG. 10, the BiCMOS circuit differs from the BiCMOS circuit shown in FIG. 9 in that the PMOSFET 88 shown in FIG. 9 is replaced with an n-type field-effect transistor (NMOSFET) 91 and an n-type field-effect transistor (NMOSFET) 92. The n-type field-effect transistor 91 has a drain connected to the base of the npn-type bipolar transistor 85 and a gate connected to the input terminal 81. The n-type field-effect transistor 92 has a drain and a gate connected to the source of the n-type field-effect transistor 91 and a source connected to the low-potential power supply terminal 84.

The BiCMOS circuit shown in FIG. 10 operates as follows:

The BJTs 85, 86 of the BiCMOS circuit according to the sixth embodiment have a turn-on voltage $V_F$ of 0.8 V. The BiCMOS circuit has a high-level OUTPUT potential VOH (VCC−$V_F$) and a low-level OUTPUT potential VOL (GND+$V_F$). Therefore, as with the fifth embodiment, a low-level potential at the emitter of the BJT 85, which serves as a load pull-up transistor, is (GND+$V_F$), and a low-level potential at the emitter of the BJT 86, which serves as a load pull-down transistor, is GND. A low-level potential at the base of the BJT 85 is determined by a turn-on voltage Vtn92 of the NMOSFET 92, and a low-level potential at the base of the BJT 86 is determined by a turn-on voltage Vtp90 of the PMOSFET 90.

Accordingly, if it is assumed that a change Va in the potential at the bases of the BJTs 85, 86 is 0.2 V, then the BiCMOS circuit can be designed such that the turn-on voltage Vtp90 of the PMOSFET 90 is 0.6 V and the turn-on voltage Vtn92 of the NMOSFET 92 is 1.4 V.

Figure 11:
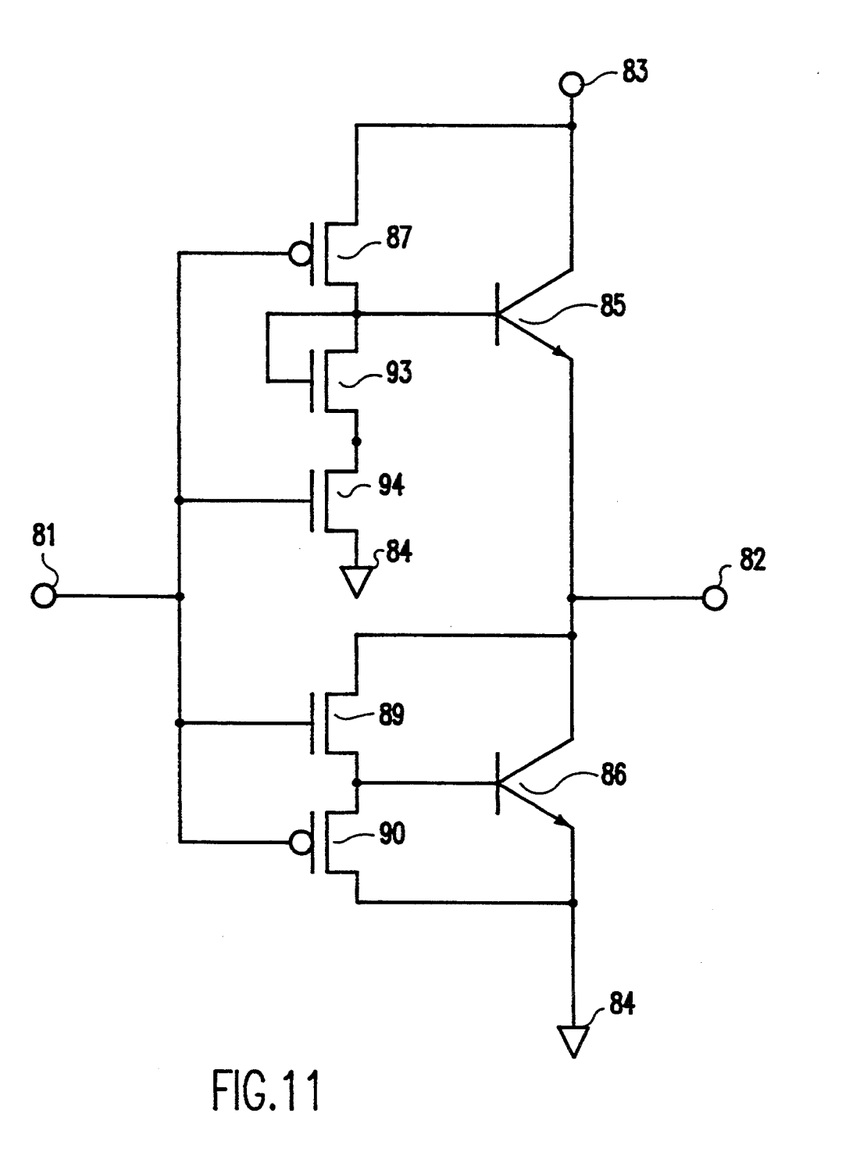
FIG. 11 is a circuit diagram of a seventh embodiment of a BiMIS circuit according to the present invention.

FIG. 11 shows a seventh embodiment of a BiMIS circuit according to the present invention. As shown in FIG. 11, the BiMIS circuit differs from the BiMIS circuit shown in FIG. 9 in that the PMOSFET 88 shown in FIG. 9 is replaced with an n-type field-effect transistor (NMOSFET) 93 and an n-type field-effect transistor (NMOSFET) 94. The n-type field-effect transistor 93 has a drain and a gate connected to the base of the npn-type bipolar transistor 85. The n-type field-effect transistor 94 has a drain connected to the source of the n-type field-effect transistor 93, a gate connected to the input terminal 81, and a source connected to the low-potential power supply terminal 84.

Stated otherwise, the BiMIS circuit shown in FIG. 11 is substantially the same as the BiMIS circuit shown in FIG. 10 except that the NMOSFETs 93, 94 are series-connected to each other in reverse with respect to the NMOSFETs 91, 92 shown in FIG. 10. Therefore, a change Va in the potential at the bases of the BJTs 85, 86 can be set to 0.2 V to establish a turn-on voltage Vtn93 of the NMOSFET 93 and a turn-on voltage Vtp90 of the PMOSFET 90. Specifically, the turn-on voltage Vtn93 can be set to 1.4 V and the turn-on voltage Vtp90 can be set to 0.6 V.

The BiMIS circuits according to the sixth and seventh embodiments can operate more quickly than the BiCMOS circuit according to the fifth embodiment because a signal applied to the gates of all the MOSFETs is supplied from the input terminal 81. The BiMIS circuit according to the sixth embodiment operates essentially in the same manner as the BiMIS circuit according to the seventh embodiment and differs structurally only in that the NMOSFETs for lowering the potential at the base node of the load pull-up BJT are differently connected.

Assuming a BiCMOS process with 0.55 μm, a CMOS inverter circuit and inverter circuits composed of the BiMIS circuits according to the fifth, sixth, and seventh embodiments of the present invention are compared with each other regarding delay times under the conditions of an input capacitance of 0.1 pF, fan-out 4, and VCC=2.5 V. Comparison results show that the BiMIS circuit according to the third embodiment of the present invention operates 1.3 times faster, and the BiMIS circuit according to the fourth and fifth embodiments of the present invention operate 1.4 times faster than the CMOS inverter circuit.

As described above, in the BiMIS circuits according to the present invention, when the BJTs are nonconductive, the base potential thereof is kept higher than the emitter potential thereof by the turn-on voltage of the FETs. Therefore, the time required to turn on the BJTs is greatly reduced, with the result that the BJTs can operate more quickly at a voltage of 3.3 V or lower than a CMOS circuit having the same process, input capacitance, and power supply voltage. The BiCMOS circuits according to the present invention can therefore be a very useful basic gate circuit for use in an LSI circuit that is required to operate at high speed with low voltage requirements.

While a preferred embodiment of the invention has been described using specific terms, such description is for illustrative purposes only, and it is to be understood that changes and variations may be made without departing from the spirit or scope of the following claims.

What is claimed is:

1. A BiMIS circuit comprising:
   an input terminal;
   an output terminal;
   a first npn-type bipolar transistor having a collector connected to a high-potential power supply terminal and an emitter connected to said output terminal;
   a first p-type field-effect transistor having a source connected to said high-potential power supply terminal, a gate connected to said input terminal, and a drain connected to the base of said first npn-type bipolar transistor;
   a first n-type field-effect transistor having a drain connected to the base of said first npn-type bipolar transistor and a gate connected to said input terminal;
   a second n-type field-effect transistor having a drain and a gate connected to the source of said first n-type field-effect transistor and a source connected to a low-potential power supply terminal;
   a second npn-type bipolar transistor having a collector connected to said output terminal and an emitter connected to said low-potential power supply terminal;
   a third n-type field-effect transistor having a source connected to the base of said second npn-type bipolar transistor, a gate connected to said input terminal, and a drain connected to the drain and the gate of said second n-type field-effect transistor; and
   a second p-type field-effect transistor having a source connected to the base of said second npn-type bipolar transistor, a gate connected to said input terminal, and a drain connected to said low-potential power supply terminal;
   the arrangement being such that said second n-type field-effect transistor has a turn-on voltage lower than a turn-on voltage of said first npn-type bipolar transistor, and when said first npn-type bipolar transistor is nonconductive, the potential at the base of said first npn-type bipolar transistor is kept higher than the potential at the emitter of the first npn-type bipolar transistor by the turn-on voltage of said second n-type field-effect transistor, and that said second p-type field-effect transistor has a turn-on voltage lower than a turn-on voltage of said second npn-type bipolar transistor, and when said second npn-type bipolar transistor is nonconductive, the potential at the base of said second npn-type bipolar transistor is kept higher than the potential at the emitter of the second npn-type bipolar transistor by the turn-on voltage of said second p-type field-effect transistor.

2. A BiMIS circuit comprising:
   an input terminal;
   an output terminal;
   a first pnp-type bipolar transistor having a collector connected to a low-potential power supply terminal and an emitter connected to said output terminal;
   a first n-type field-effect transistor having a source connected to said low-potential power supply terminal, a gate connected to said input terminal, and a drain connected to the base of said first pnp-type bipolar transistor;

a first p-type field-effect transistor having a drain connected to the base of said first pnp-type bipolar transistor and a gate connected to said input terminal;

a second p-type field-effect transistor having a drain and a gate connected to the source of said first p-type field-effect transistor and a source connected to a high-potential power supply terminal;

a second pnp-type bipolar transistor having a collector connected to said output terminal and an emitter connected to said high-potential power supply terminal;

a third p-type field-effect transistor having a source connected to the base of said second pnp-type bipolar transistor, a gate connected to said input terminal, and a drain connected to the drain and the gate of said second p-type field-effect transistor; and a second n-type field-effect transistor having a source connected to the base of said second pnp-type bipolar transistor, a gate connected to said input terminal, and a drain connected to said high-potential power supply terminal;

the arrangement being such that said second p-type field-effect transistor has a turn-on voltage lower than a turn-on voltage of said first pnp-type bipolar transistor, and when said first pnp-type bipolar transistor is nonconductive, the potential at the base of said first pnp-type bipolar transistor is kept lower than the potential at the emitter of the first pnp-type bipolar transistor by the turn-on voltage of said second p-type field-effect transistor, and that said second n-type field-effect transistor has a turn-on voltage lower than a turn-on voltage of said second pnp-type bipolar transistor, and when said second pnp-type bipolar transistor is nonconductive, the potential at the base of said second pnp-type bipolar transistor is kept lower than the potential at the emitter of the second pnp-type bipolar transistor by the turn-on voltage of said second n-type field-effect transistor.

3. A BiMIS circuit comprising:

an input terminal;

an output terminal;

a bipolar transistor having a base connected to said input terminal, an emitter connected to a first power supply terminal, and a collector connected to said output terminal and through a load to a second power supply terminal; and a field-effect transistor having a source and a gate connected to said input terminal and a drain connected to said first power supply terminal, such that the field-effect transistor is rendered conductive when said bipolar transistor is nonconductive;

the arrangement being such that said field-effect transistor has a turn-on voltage lower than a turn-on voltage of said bipolar transistor, and when said bipolar transistor is nonconductive, the potential at the base of said bipolar transistor is kept at a level which is different from the potential at the emitter of the bipolar transistor by the turn-on voltage of said field-effect transistor.

4. A BiMIS circuit comprising:

an input terminal;

an output terminal;

an npn-type bipolar transistor having a base connected to said input terminal, an emitter connected to a low-potential power supply terminal, and a collector connected to said output terminal and through a load to a high-potential power supply terminal; and a p-type field-effect transistor having a source and a gate connected to said input terminal and a drain connected to said first power supply terminal, such that the field-effect transistor is rendered conductive when said bipolar transistor is nonconductive;

the arrangement being such that said field-effect transistor has a turn-on voltage lower than a turn-on voltage of said bipolar transistor, and when said bipolar transistor is nonconductive, the potential at the base of said bipolar transistor is kept at a level which is different from the potential at the emitter of the bipolar transistor by the turn-on voltage of said field-effect transistor.

5. A BiMIS circuit comprising:

an input terminal;

an output terminal;

a pnp-type bipolar transistor having a base connected to said input terminal, an emitter connected to a high-potential power supply terminal, and a collector connected to said output terminal and through a load to a low-potential power supply terminal; and an n-type field-effect transistor having a source and a gate connected to said input terminal and a drain connected to said first power supply terminal, such that the field-effect transistor is rendered conductive when said bipolar transistor is nonconductive;

the arrangement being such that said field-effect transistor has a turn-on voltage lower than a turn-on voltage of said bipolar transistor, and when said bipolar transistor is nonconductive, the potential at the base of said bipolar transistor is kept at a level which is different from the potential at the emitter of the bipolar transistor by the turn-on voltage of said field-effect transistor.

6. A BiMIS circuit comprising:

an input terminal;

an output terminal;

a first npn-type bipolar transistor having a collector connected to a high-potential power supply terminal and an emitter connected to said output terminal;

a first p-type field-effect transistor having a source connected to said high-potential power supply terminal, a gate connected to said input terminal, and a drain connected to the base of said first npn-type bipolar transistor;

a second p-type field-effect transistor having a drain connected to the base of said first npn-type bipolar transistor, a gate connected to said output terminal, and a drain connected to a low-potential power supply terminal;

a second npn-type bipolar transistor having a collector connected to said output terminal and an emitter connected to said low-potential power supply terminal;

a first n-type field-effect transistor having a source connected to the base of said second npn-type bipolar transistor, a gate connected to said input terminal, and a drain connected to said output terminal; and a third p-type field-effect transistor having a source connected to the base of said second npn-type bipolar transistor, a gate connected to said input terminal, and a drain connected to said low-potential power supply terminal;

the arrangement being such that said second p-type field-effect transistor has a turn-on voltage lower than a turn-on voltage of said first npn-type bipolar transistor, and when said first npn-type bipolar transistor is nonconductive, the potential at the base of said first npn-type bipolar transistor is kept higher than the potential at the emitter of the first npn-type bipolar transistor by the turn-on voltage of said second p-type field-effect transistor, and that said third p-type field-effect transistor has a turn-on voltage lower than a turn-on voltage of said second npn-type bipolar transistor, and when said second npn-type bipolar transistor is nonconductive, the potential at the base of said second npn-type bipolar transistor is kept higher than the potential at the emitter of the second npn-type bipolar transistor by the turn-on voltage of said third p-type field-effect transistor.

7. A BiMIS circuit comprising:

an input terminal;

an output terminal;

a first npn-type bipolar transistor having a collector connected to a high-potential power supply terminal and an emitter connected to said output terminal;

a first p-type field-effect transistor having a source connected to said high-potential power supply terminal, a gate connected to said input terminal, and a drain connected to the base of said first npn-type bipolar transistor;

a first n-type field-effect transistor having a drain connected to the base of said first npn-type bipolar transistor and a gate connected to said input terminal;

a second n-type field-effect transistor having a drain and a gate connected to the source of said first n-type field-effect transistor, and a source connected to a low-potential power supply terminal;

a second npn-type bipolar transistor having a collector connected to said output terminal and an emitter connected to said low-potential power supply terminal;

a third n-type field-effect transistor having a source connected to the base of said second npn-type bipolar transistor, a gate connected to said input terminal, and a drain connected to said output terminal; and a second p-type field-effect transistor having a source connected to the base of said second npn-type bipolar transistor, a gate connected to said input terminal, and a drain connected to said low-potential power supply terminal;

the arrangement being such that said second n-type field-effect transistor has a turn-on voltage lower than a turn-on voltage of said first npn-type bipolar transistor, and when said first npn-type bipolar transistor is nonconductive, the potential at the base of said first npn-type bipolar transistor is kept higher than the potential at the emitter of the first npn-type bipolar transistor by the turn-on voltage of said second n-type field-effect transistor, and that said second p-type field-effect transistor has a turn-on voltage lower than a turn-on voltage of said second npn-type bipolar transistor, and when said second npn-type bipolar transistor is nonconductive, the potential at the base of said second npn-type bipolar transistor is kept higher than the potential at the emitter of the second npn-type bipolar transistor by the turn-on voltage of said second p-type field-effect transistor.

8. A BiCMOS circuit comprising:

an input terminal;

an output terminal;

a first npn-type bipolar transistor having a collector connected to a high-potential power supply terminal and an emitter connected to said output terminal;

a first p-type field-effect transistor having a source connected to said high-potential power supply terminal, a gate connected to said input terminal, and a drain connected to the base of said first npn-type bipolar transistor;

a first n-type field-effect transistor having a drain and a gate connected to the drain of said first p-type field-effect transistor;

a second n-type field-effect transistor having a drain connected to the source of said first p-type field-effect transistor, a gate connected to said input terminal, and a source connected to a low-potential power supply terminal;

a second npn-type bipolar transistor having a collector connected to said output terminal and an emitter connected to said low-potential power supply terminal;

a third n-type field-effect transistor having a source connected to the base of said second npn-type bipolar transistor, a gate connected to said input terminal, and a drain connected to said output terminal; and a second p-type field-effect transistor having a source connected to the base of said second npn-type bipolar transistor, a gate connected to said input terminal, and a drain connected to said low-potential power supply terminal;

the arrangement being such that said first n-type field-effect transistor has a turn-on voltage lower than a turn-on voltage of said first npn-type bipolar transistor, and when said first npn-type bipolar transistor is nonconductive, the potential at the base of said first npn-type bipolar transistor is kept higher than the potential at the emitter of the first npn-type bipolar transistor by the turn-on voltage of said first n-type field-effect transistor, and that said second p-type field-effect transistor has a turn-on voltage lower than a turn-on voltage of said second npn-type bipolar transistor, and when said second npn-type bipolar transistor is nonconductive, the potential at the base of said second npn-type bipolar transistor is kept higher than the potential at the emitter of the second npn-type bipolar transistor by the turn-on voltage of said second p-type field-effect transistor.

* * * * *